United States Patent [19]

Harima

[11] Patent Number: 5,715,202

[45] Date of Patent: Feb. 3, 1998

[54] SEMICONDUCTOR MEMORY DEVICE

[75] Inventor: Takayuki Harima, Kawaguchi, Japan

[73] Assignee: Kabushiki Kaisha Toshiba, Tokyo, Japan

[21] Appl. No.: 577,205

[22] Filed: Dec. 21, 1995

[30] Foreign Application Priority Data

Dec. 22, 1994 [JP] Japan .................................. 6-320861

[51] Int. Cl.$^6$ ............................................. G11C 13/00
[52] U.S. Cl. ........................ 365/200; 365/189.01; 365/210
[58] Field of Search ................................... 365/200, 210

[56] References Cited

U.S. PATENT DOCUMENTS 5,446,692  8/1995  Haraguchi et al. ..................... 365/200
5,450,361  9/1995  Iwahashi et al. ...................... 365/200

*Primary Examiner*—Terrell W. Fears
*Attorney, Agent, or Firm*—Loeb & Loeb LLP

[57] ABSTRACT

A semiconductor memory device includes memory cell array blocks and row spare cell groups provided for the memory cell array blocks adjacent to each other and each of the row spare cell groups having a plurality of spare cells for relieving defective memory cells in the adjacent memory cell array blocks. The row spare cell groups are shared by the plurality of adjacent memory cell array blocks, hence the spare cells are allocated corresponding to the defective cells found in the memory cell array blocks, thus enhancing a relieving rate by a redundancy circuit.

28 Claims, 8 Drawing Sheets

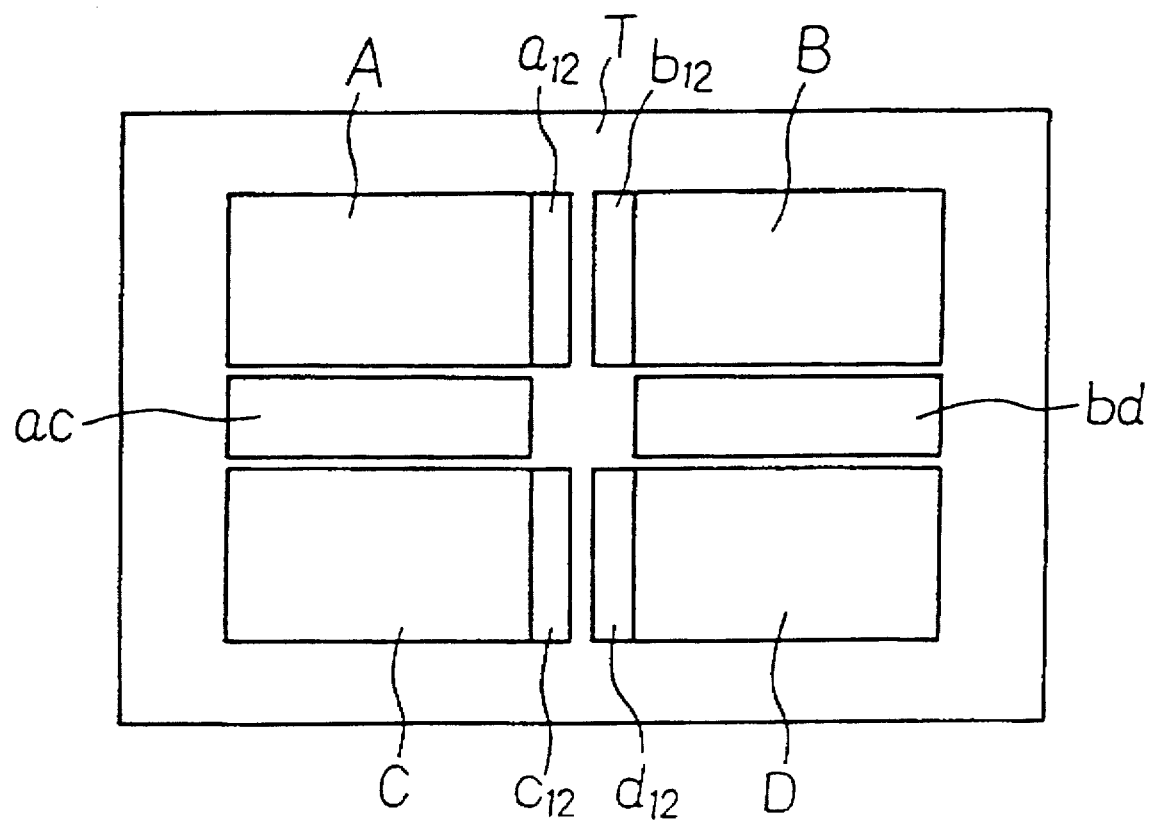
F I G. 1

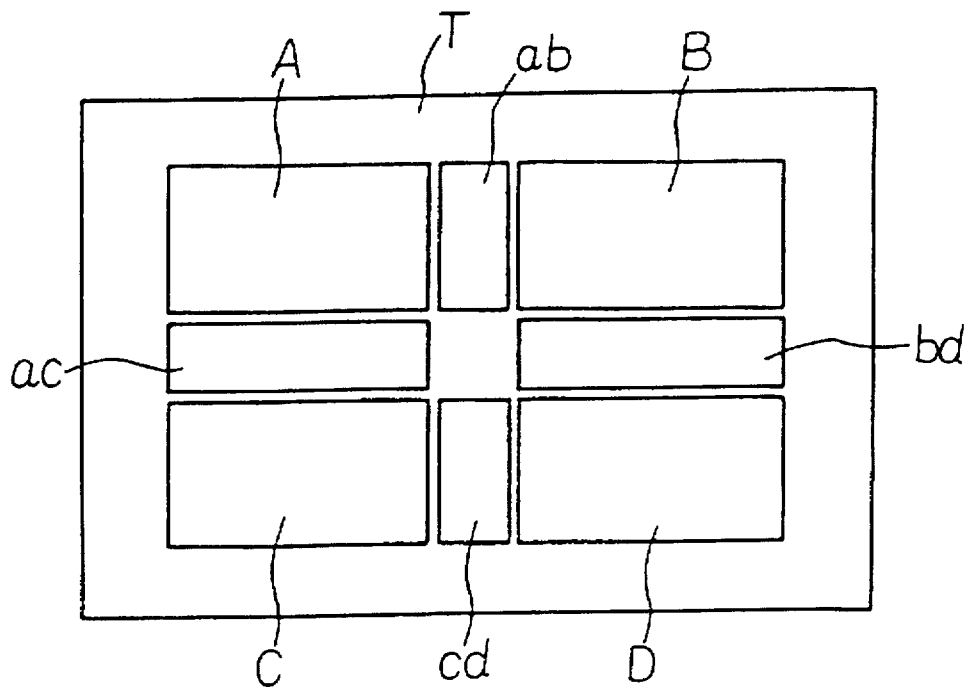
F I G. 2
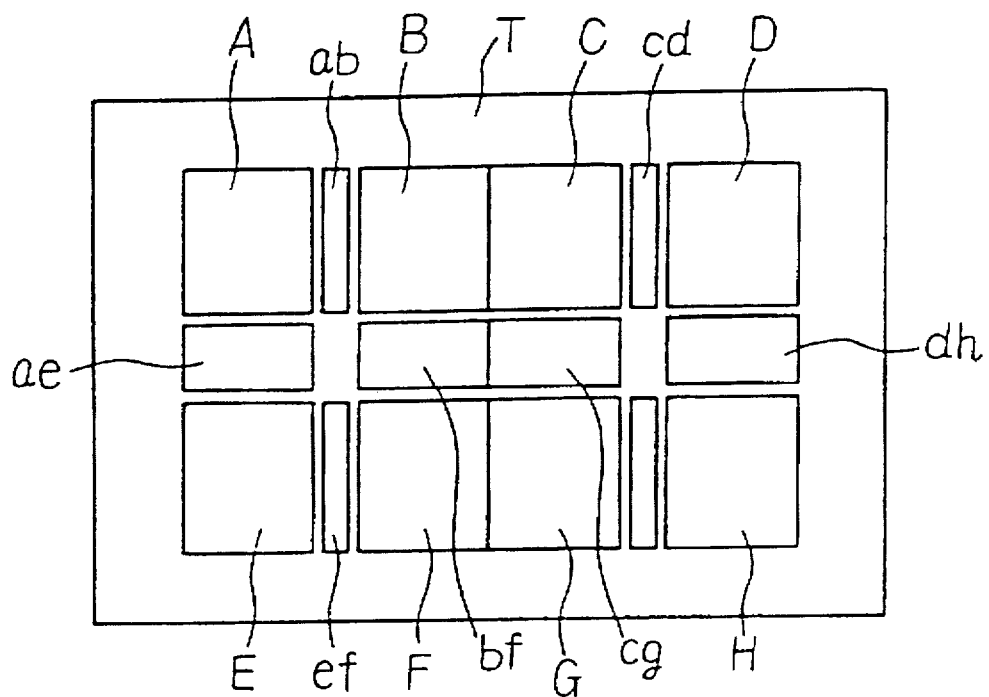
F I G. 3

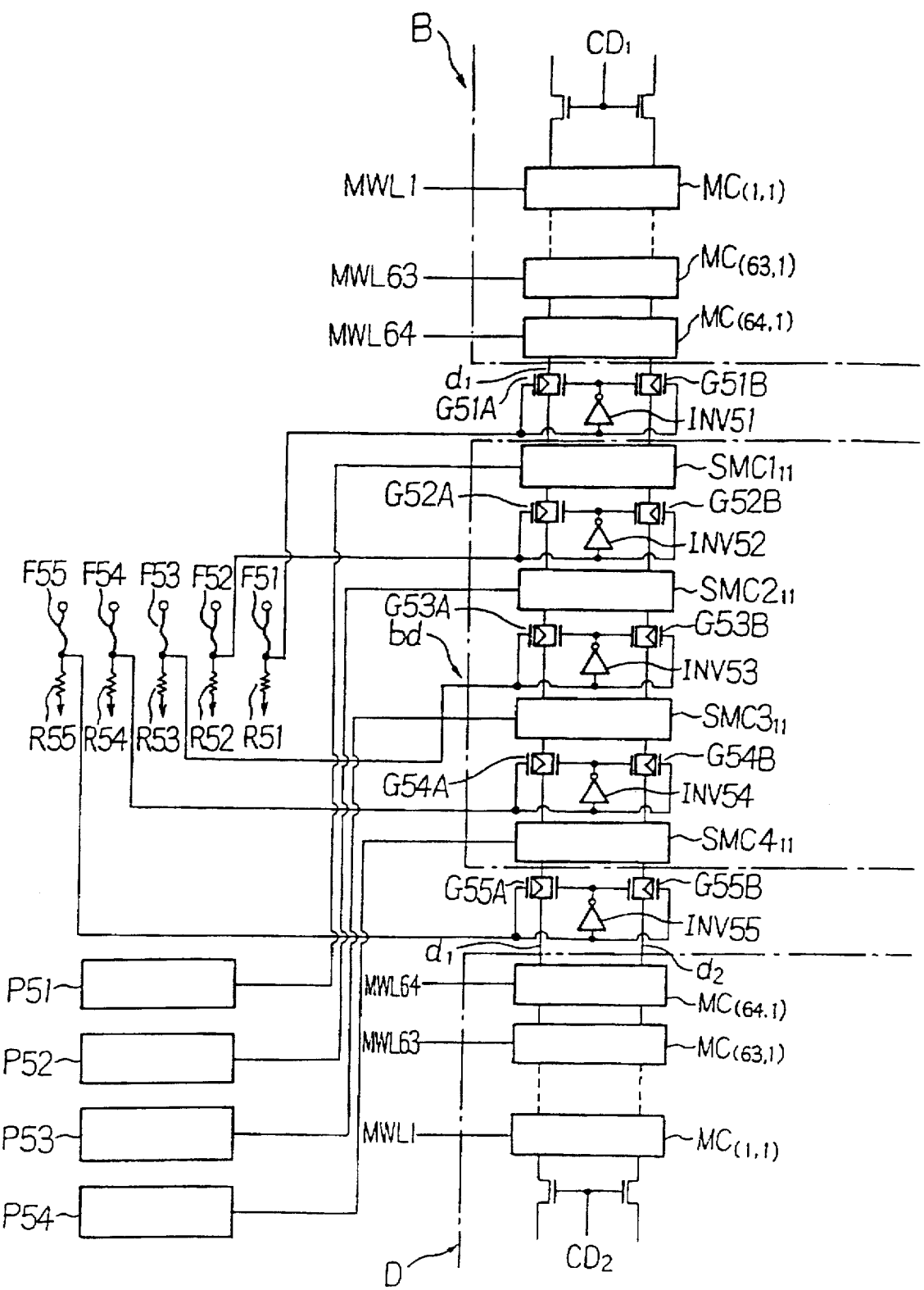
F I G. 4

SEMICONDUCTOR MEMORY DEVICE

BACKGROUND OF THE INVENTION

1. Field of the Invention

This invention relates to a semiconductor memory device including a redundancy circuit.

2. Description of the Background Art

A redundancy circuit in a semiconductor memory device is a circuit for relieving a defective memory cell, when a memory cell of memory cell arrays is found to be defective. This circuit has spare cell group(s) arranged in a row and/or a column for every memory cell array block arranged in a chip, and a program circuit for effecting replacement of the row or column memory cell group containing the defective cell with a row or column spare cell group provided in the memory cell array block. Therefore, a relieving rate by the redundancy circuit largely varies depending on the number of row or column spare cell groups provided for the respective memory cell array blocks.

FIG. 8 schematically shows a construction of a conventional semiconductor memory device including a redundancy circuit. In a memory chip T, there are provided four memory cell array blocks A, B, C, D and spare cell groups. The row spare groups a11 and c11 are disposed between the memory cell array blocks A and C, row spare cell groups b11 and d11 are disposed between the memory cell array blocks B and D, column spare cell groups a12 and b12 are disposed between the memory cell array blocks A and B, and column spare cell groups c12 and d12 are disposed between the memory cell array blocks C and D.

FIG. 9 illustrates in detail a connection of the memory cell array block to the row spare cell group in the configuration shown in FIG. 8. Shown in FIG. 9 are the memory cell array block B, the row spare cell group b11 corresponding thereto, the memory cell array block D and the row spare cell group d11 corresponding thereto. The respective memory cell array blocks B, D include a plurality of memory cells MC(1, 1), . . . , MC(63, 1), MC(64, 1), . . . arranged therein. The memory cells MC(1, 1), . . . , MC(63, 1), MC(64, 1) are commonly connected to a bit line pair d1, d2. Furthermore, word lines MWL1, . . . , MWL63, MWL64 are connected to the respective memory cells MC(1, 1), . . . , MC(63, 1), MC(64, 1). These word lines MWL1, . . . , MWL63, MWL64 are connected to a decoder (not shown).

The row spare cell group b11 is connected via the bit line pair d1, d2 to the above-mentioned memory cell array block B. This row spare cell group b11 has spare cells SMC111 and SMC211 for two rows. The spare cells SMC111 and SMC211 are connected to program circuits P111 and P112, respectively. The program circuit is a circuit for selecting, when an address of a defective memory cell is selected, the spare cell instead. Similarly, the memory cell array block D includes the row spare cell group d11 having spare cells SMC311 and SMC411 for two rows. These row spare cells are connected to program circuits P113 and P114, respectively.

Furthermore, the column spare cell groups b12 and d12 are similarly constructed. In addition, the configurations are the same with respect to other memory cell array blocks A and C, the row space cell groups a11 and c11 thereof and column spare cell groups a12 and c12 thereof.

When, in a chip, the row spare cell groups a11, b11, c11 and d11, and the column spare cell groups a12, b12, c12 and d12 are provided by two row and by two columns in the respective memory cell array blocks A, B, C and D, the chip can be relieved even if defective cells for two rows and two columns are found for the individual memory cell array blocks A, B, C and D. However, even if no defective cell exists in the memory cell array blocks A, B and C, and if the defective cells for three rows are found in only the memory cell array block D, such a chip can not be relieved by the redundancy circuit. Therefore, this chip is treated as defective. Even in such a case, the relief thereof requires providing at least one additional row spare cell group and the program circuit for selecting this row spare cell group in a memory cell array block.

If the number of row or column spare cell groups is increased for enhancing the relieving rate, however, with this increase, there also increase the number of the spare cells and the number of program circuits for selecting addresses of the spare cells. This leads to a problem in which a chip size is enlarged.

Furthermore, as illustrated in FIG. 10, Japanese Patent Laid-Open Publication No. 60-130139 discloses a construction capable of coping with many defective cells with a small number of column redundancy cell groups by changing correspondence of the redundancy cell groups to blocks in use.

More specifically, redundancy cell groups 14 and 16 are provided with switches S1–S3 so that these groups can be connected to either the data bus 18 or the data bus 20. If the cell block 10 has a defective memory cell on one column thereof, the redundancy cell group 14 can substitute for this defective memory cell by closing the switch S2 with the switch S1 opened. Furthermore, if the cell block 10 has defective memory cells in dispersion on two columns, and if the cell block 12 has no defective cell, by closing the switch S1 with the switch S3 opened, the redundancy cell group 16 is adapted to belong to the cell block 10. As a result, the redundancy cell group 14 can substitute for the defective memory cell belonging to one column of the cell block 10, while the redundancy cell group 16 can substitute for the defective memory cell belonging to the other column, thereby making it possible to relieve a memory including defective memory cells.

Herein, there are proposed the following methods of providing the spare cell groups in common with respect to the column in the case that the input and output take multi-bit configurations.

According to a first method, column spare cell groups corresponding to the number of bits are prepared, and, if defective memory cells exist in one of the columns, the column containing the defective memory cells of all the bits can be switched en bloc over to the column spare cell group. According to this method, however, the column spare cell group requires a broad area given by (the number of spares of the column spare cell group)×(the number of I/O bits), and this gives a large influence on the chip size.

According to a second method, the column spare cell groups are made usable in common to every bit, and, if the defective memory cells exist in one of the columns, only the 1-bit column containing the defective memory cells can be switched individually over to the column spare cell group. According to this method, however, as compared with the case where all the bits are switched en bloc as done in the first method, a control circuit for allocating the column spare cell groups to the bits is necessary and extra time for the control thereof is necessary. Consequently, this remarkably affects the normal accessing operation.

SUMMARY OF THE INVENTION

It is a primary object of the present invention, which was devised in view of the problems given above, to improve a relieving rate by a redundancy circuit without increasing the number of row or column spare cell groups.

When the input and output take multi-bit configurations, and when the spare cell group is provided in common for row, there exists no distinction like the I/O unit as in the case of column. Hence, it is possible to readily perform switchover to a row spare cell group, and the influences both on chip size and on normal accessing are small.

According to one aspect of the present invention, there is provided, a semiconductor memory device comprising:

- a memory cell array having a plurality of memory cell array blocks arranged in matrix form, said memory cell array block having a plurality of memory cells arranged in matrix form; and
- a spare cell group arranged between said memory cell array blocks adjacent to each other for relieving a defective memory cell in said memory cell array blocks;
- wherein said spare cell group includes a row spare cell group provided between said plurality of said memory cell array blocks arranged in a row direction, said row spare cell group having a plurality of row spare cells arranged in the row direction; and
- wherein said row spare cells of said row spare cell group are shared by said memory cell array blocks on both sides of said row spare cell group in the row direction depending on an occurrence status of said defective memory cell in said memory cell array blocks on both sides.

According to another aspect of the present invention, there is provided, a semiconductor memory device comprising:

- a memory cell array having a plurality of memory cell array blocks arranged in matrix form, said memory cell array block having a plurality of memory cells arranged in matrix form; and
- a spare cell group arranged between said memory cell array blocks adjacent to each other for relieving a defective memory cell in said memory cell blocks;
- wherein said spare cell group includes:
  - a row spare cell group provided between said plurality of said memory cell array blocks arranged in a row direction, said row spare cell group having a plurality of row spare cells arranged in the row direction and
  - a column spare cell group provided between said plurality of memory cell array blocks arranged in a column direction, said column spare cell group having a plurality of column spare cells arranged in the column direction; and
- wherein said row spare cells of said row spare cell group are shared by said memory cell array blocks on both sides of said row spare cell group in the row direction depending on an occurrence status of said defective memory cell in said memory cell array blocks on both sides in the row direction, and
- said column spare cells of said column spare cell group are shared by said memory cell array blocks on both sides of said column spare cell group in the column direction depending on the occurrence status of said defective memory cell in said memory cell array blocks on both sides in the column direction.

The row spare cell groups are connected to memory cell array blocks on both sides in row directions respectively via switching elements, and it is desirable that the above defective cells be relieved by controlling the switching elements in accordance with the location of defective cells found in the respective memory cell array blocks.

Moreover, the switching elements are provided between rows of the row spare cell groups. The switching element may include transfer gates for allocating the spare cells by being selectively cut off in accordance with the location of defective cells found in the memory cell array blocks on both sides and a control circuit for controlling the cut-off of the transfer gates.

The spare cell groups are shared by the plurality of memory cell array blocks adjacent to each other, and the spare cells are allocated corresponding to the defective cells found on the memory cell array blocks. Hence, the relieving rate is more enhanced even in the case of the same number of spare cells than in the case of providing the peculiar spare cell groups usable only in the respective memory cell array blocks.

BRIEF DESCRIPTION OF THE DRAWINGS

Other objects and advantages of the present invention will become apparent during the following discussion with reference to the accompanying drawings, in which:

FIG. 1 is a schematic plan view illustrating a first embodiment of the present invention;

FIG. 2 is a schematic plan view showing a second embodiment of the present invention;

FIG. 3 is a schematic plan view showing a third embodiment of the present invention;

FIG. 4 is a diagram illustrating details of the principal portion in the first embodiment;

DESCRIPTION OF THE PREFERRED EMBODIMENTS

Figure 5:
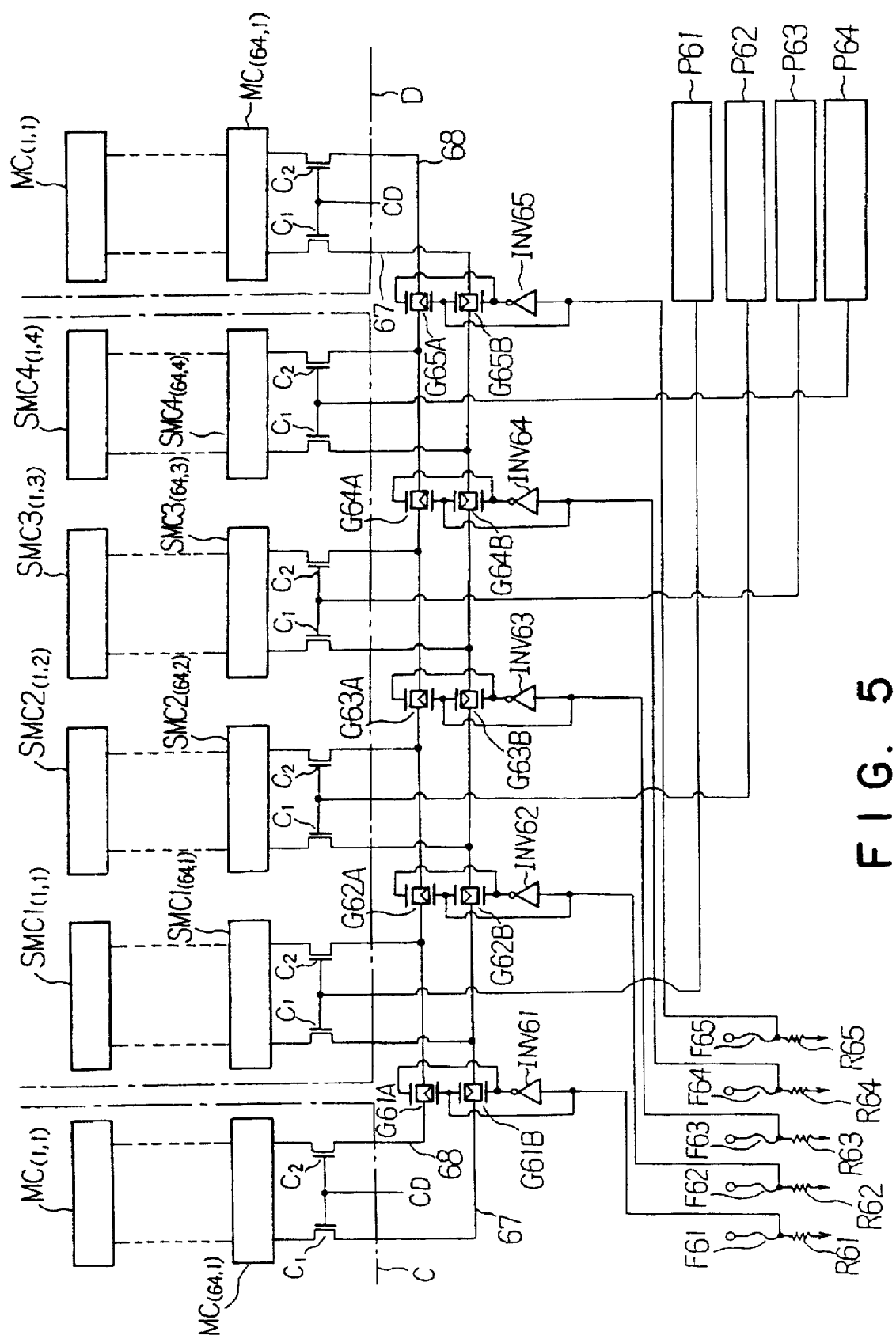
FIG. 5 is a diagram illustrating details of the principal portion of a column spare cell group.

Some embodiments of the present invention will hereinafter be discussed with reference to the accompanying drawings. In these embodiments, memory cell array blocks adjacent to each other share a spare cell group with each other, thereby enhancing a relieving rate.

FIG. 1 illustrates a first embodiment in which a row spare cell group is shared. A chip T has four memory cell array blocks A, B, C and D. Memory cells are arranged in matrix form in each memory cell block. A row spare cell group ac shared thereby is disposed between memory cell array blocks A and C. A row spare cell group bd shared thereby is disposed between memory cell array blocks B and D. Each of the row spare cell groups ac and bd has the spare cells arranged in 4 rows. Further, the respective memory array blocks A, B, C and D are provided with column spare cell groups a12, b12, c12 and d12 peculiar thereto. Each of these column spare cell groups is provided with the spare cells arranged in 2 columns. Based on this configuration, for example, in the case where each memory cell array block has 1024 memory cells in the row direction and 1024 memory cells in the column direction, it follows that the row spare cell groups for 4 rows have 4096 spare cells.

Given hereinafter is an explanation of a case where the spare cell group ac is shared by the memory cell array blocks A and C in comparison with a conventional case where the row spare cell group is not shared for a combination of relievable rows.

In the conventional example, as described above, the individual memory cell array blocks A and C have spare cell groups a11 and c11 peculiar thereto, and the spare cells are arranged by two rows. In accordance with this embodiment, the row spare cell group ac is provided with the spare cells for 4 rows. In any case, the total number of spare cells is the same.

Thus, the following are combinations of relievable rows containing defective cells in the memory cell array blocks A and C. In the conventional example, eight combinations are prepared such as (A, C)=(0, 1), (0, 2), (1, 0), (1, 1), (1, 2), (2, 0), (2, 1), (2, 2). Here, the symbol (A, C) indicates the number of rows wherein defects are caused in the memory cell array block A and the number of rows wherein the defects are caused in the memory cell array block C. On the other hand, in accordance with this embodiment, in addition to the case given above, there can be newly relieved six combinations such as (A, C)=(0, 4), (1, 3), (3, 0), (3, 1), (4, 0), and, therefore, totally 14 combinations are relievable. As described above, even when the number of the spare cells is the same, the number of relievable combinations increases. Further, the number of relievable combinations increases similarly with respect to the memory cell array blocks B and D.

Thus, the number of the relievable combinations is increased by sharing the row spare cell group without any rise in the number of the spare cells, and the relieving rate can therefore be enhanced.

FIG. 2 illustrates a second embodiment in which the row and column spare cell groups are shared. The chip T is provided with the memory cell array blocks A, B, C and D. The row spare cell groups ac and bd are shared respectively by the memory cell array blocks A and C and by the memory cell array blocks B and D. The column spare cell groups ab and cd are shared by the memory cell array blocks A and B and by the memory cell array blocks C and D, respectively. Therefore, as compared with the embodiment shown in FIG. 1, a degree of freedom to which the row and column spare cells can be relieved increases, and the relieving rate is further enhanced.

The embodiment given above has dealt with such a chip in which the chip T is divided into four memory cell array blocks. FIG. 3, however, illustrates an embodiment showing eight memory cell array blocks. The interior of the chip T is formed with eight memory cell array blocks A, B, C, D, E, F, G and H. Provided are row spare cell groups ae, bf, cg and dh shared thereby and column spare cell groups ab, cd, ef and gh shared thereby.

Furthermore, the present invention is, as a matter of course, applicable to cases where the interior of the chip is divided into 16 or 32 memory cell array blocks. The row spare cell groups prepared as the spare groups are provided for 4 rows in the embodiment discussed above, also the spare cell groups may be provided for, e.g., 8 or 16 rows. The column spare cell groups may also be provided for, e.g., 8 or 16 columns.

Given next is a specific example where the above first embodiment is applied to an SRAM. It is assumed that the row spare cell group bd is shared by the memory cell array blocks B and D as described above. That is, as shown in FIG. 4, the respective memory cell array blocks B and D are connected to the row spare cell group bd. FIG. 4 shows the left ends of the respective memory cell array blocks. The memory cell array blocks B and D have a plurality of memory cells MC(1, 1), ..., MC(63, 1), MC(64, 1). The memory cells MC(1, 1), ..., MC(63, 1), MC(64, 1) are connected to each other via a bit line pair d1, d2. Further, word lines MWL1, ..., MWL63, MWL64 are connected to the respective memory cells MC(1, 1), ..., MC(63, 1), MC(64, 1). These word lines MWL1, ..., MWL63, MWL64 are selected by a decoder (not shown).

The row spare cell group bd is connected to the cell array blocks B and D by the respective bit lines d1, d2. The row spare cell group bd is provided with the spare cells SMC111, SMC211, SMC311 and SMC411 for four rows. The row spare cells SMC111 are connected to the bit lines d1, d2 of the memory cell array block B via transfer gates G51A, G51B, respectively. The respective transfer gates G51A, G51B are formed by connecting NMOS and PMOS transistors in parallel. A connection mid-point of a fuse F51 and a resistor R51 is directly connected to a gate of the PMOS transistor of the transfer gates G51A and G51B for applying a control voltage. On the other hand, the connection mid-point thereof is also connected via an inverter INV51 to a gate of the NMOS transistor.

The row spare cell SMC211 is connected to the row spare cell 51 via transfer gates G52A and G52B, and a PMOS gate thereof is, as in the same way described above, connected directly to a connection mid-point of a fuse F52 and a resistor R52. On the other hand, the connection mid-point thereof is also connected via an inverter INV52 to the gate of the NMOS transistor.

The row spare cell SMC311 is similarly connected to the row spare cell SMC211 via transfer gates G53A and G53B. A PMOS gate thereof is, as in the same way described above, connected directly to a connection mid-point of a fuse F53 and a resistor R53. On the other hand, the connection mid-point thereof is connected via an inverter INV53 to the gate of the NMOS transistor.

The row spare cell SMC411 is similarly connected to the spare cell SMC311 via transfer gates G54A and G54B. A PMOS gate thereof is, as in the same way described above, connected directly a connection mid-point of to a fuse F54 and a resistor R54. On the other hand, the connection midpoint thereof is connected via an inverter INV54 to the gate of the NMOS transistor. Further, the spare cell SMC411 is connected to the bit line pair d1, d2 of the memory cell array block D via transfer gates G55A and G55B. A connection mid-point of a fuse F55 and a resistor R55 is, as in the same way described above, directly connected to the PMOS gates thereof. On the other hand, the connection mid-point thereof is connected via an inverter INV55 to the gate of the NMOS transistor. Note that resistance values of the resistors R51–R55 and resistance values of parasitic resistances of the fuses F51–F55 are determined so that a potential of the above-mentioned connection mid-point changes by a fuse blow. That is, the values of the parasitic resistances of the respective fuses F51–F55 are set small enough to be ignorable for the resistance values of the resistors R51–R55 connected thereto. In the following discussion, it is assumed that the resistance values of the resistors and the resistance values of the parasitic resistances of the fuses bear the above relationship. The potential of the connection midpoint is changed from a potential VDD to a potential VSS by blowing those fuses F51–F55, and the individual transfer gates are controlled.

Figure 7A:
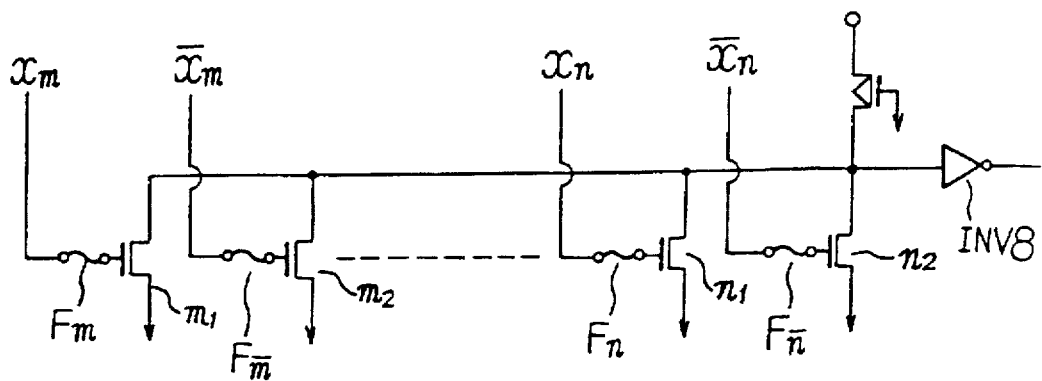
FIGS. 7A and 7B are circuit diagrams showing details of a program circuit.
Figure 7B:
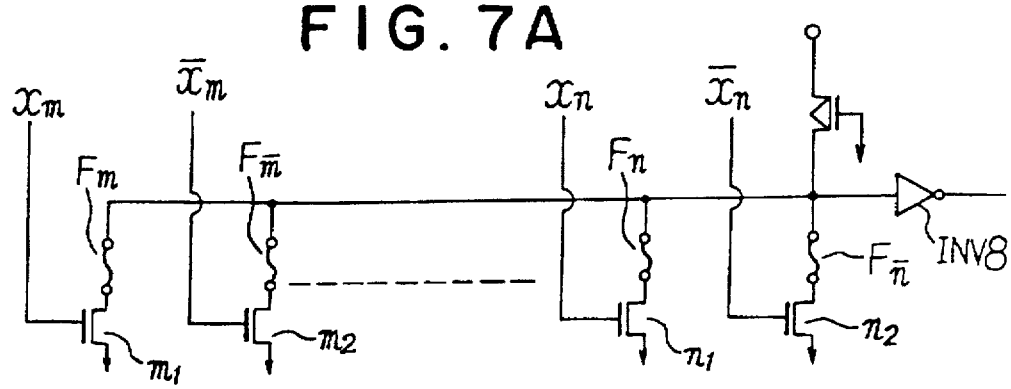
Figure 8:
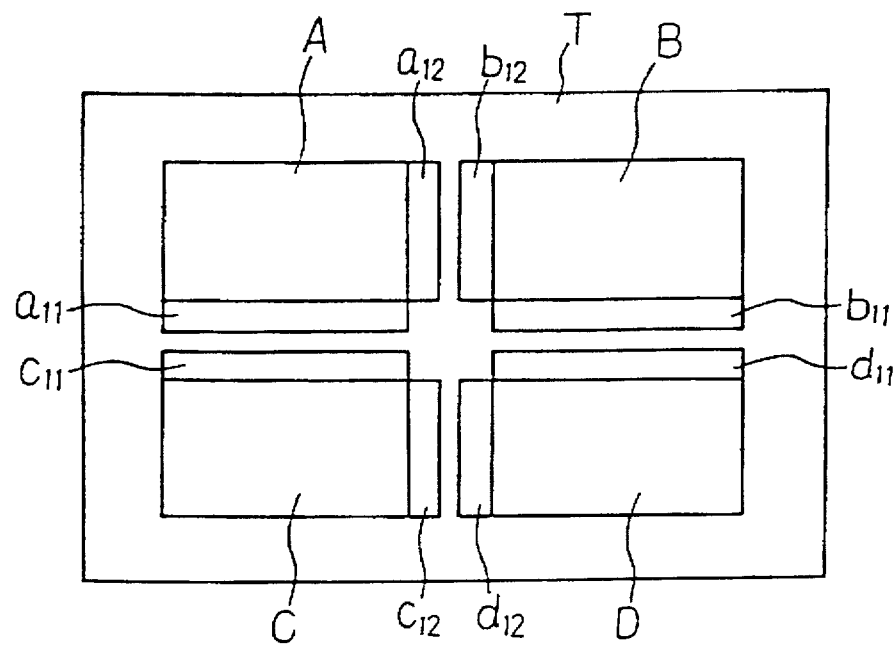
FIG. 8 is a plan view showing a prior art circuit.
Figure 9:
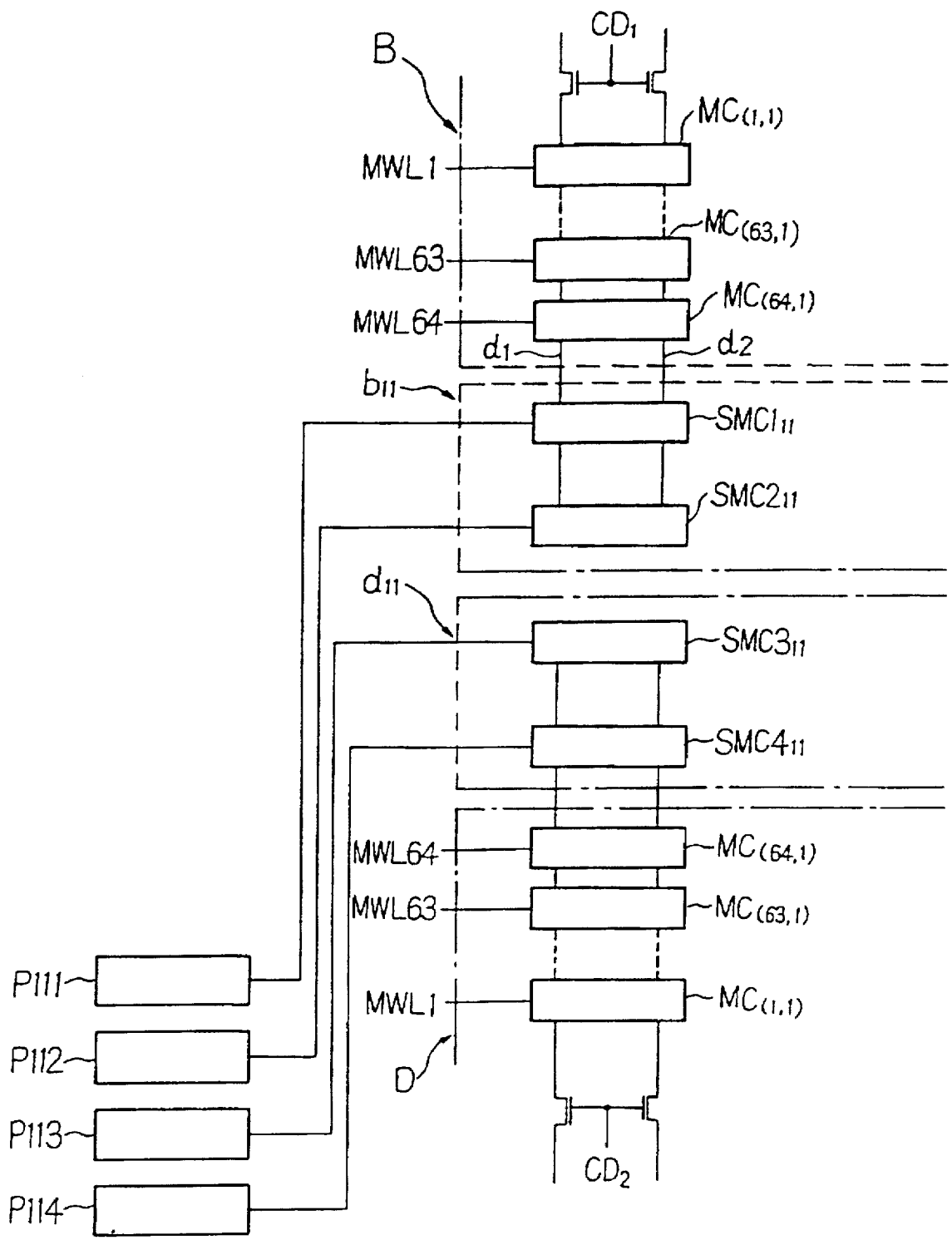
FIG. 9 is a diagram showing details of the prior art circuit.
Figure 10:
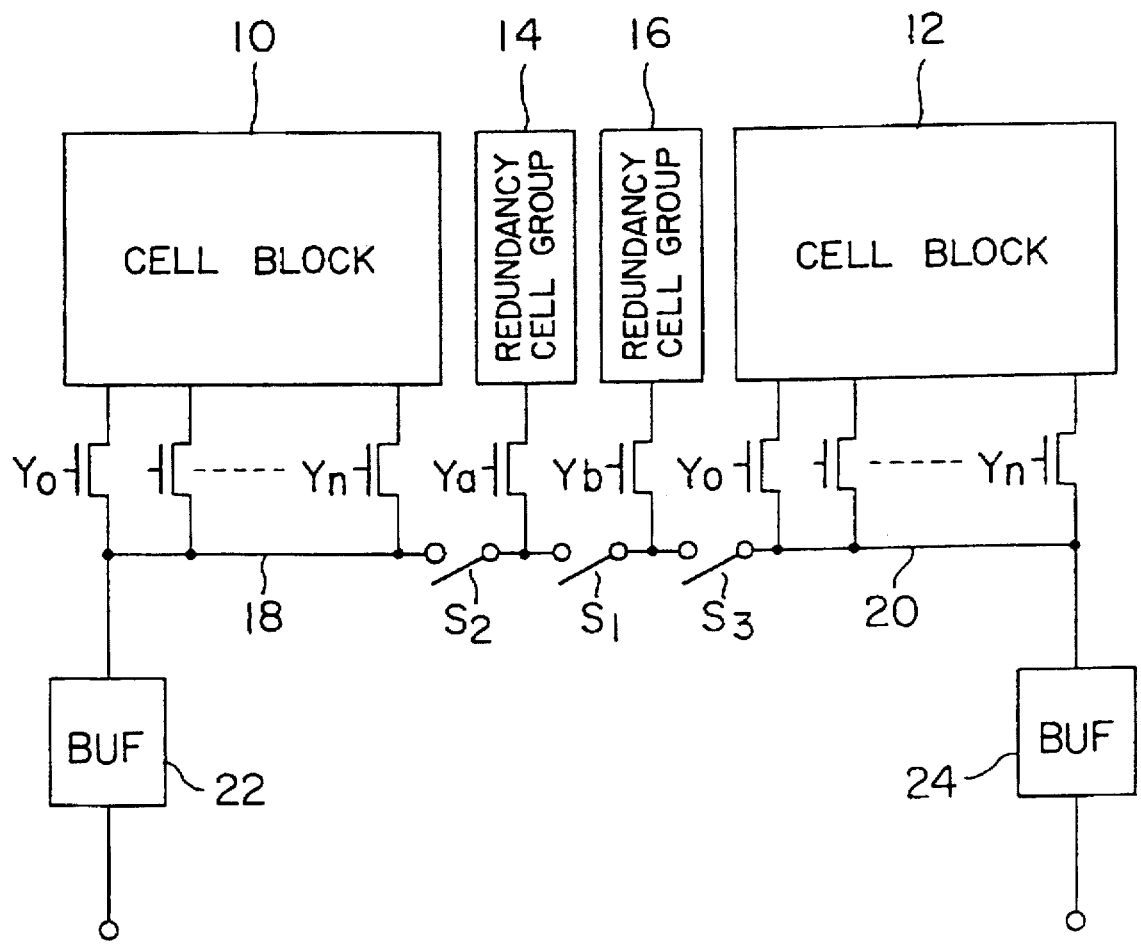
FIG. 10 is a diagram showing details of another prior art circuit.

Further, program circuits P51, P52, P53 and P54 are connected to the respective row spare cells SMC111, SMC211, SMC311 and SMC411. FIGS. 7A and 7B show circuit examples of the program circuits P51–P54. As illustrated in FIG. 7A, fuses Fm, . . . , Fn are connected respectively to gates of transistors m1, m2, . . . , n1, n2. By blowing a fuse corresponding to an address of a defective cell an address of the spare cell is thereby selected instead of the address of the defective cell when selecting that address. For example, if some defect is caused in an address xm, the fuse Fm corresponding thereto is blown. In this case, when the address xm of the defective cell is selected, a selection signal is outputted from the inverter INV8, and the corresponding spare cell is selected. FIG. 7B shows a modified example of FIG. 7A, wherein the fuses Fm, . . . , Fn may be provided as shown in the figure.

In such a configuration, an operation wherein the row spare cell group bd is allocated when the defective cell exists in the memory cell array blocks B and D will now be described. For instance, if the defective cells for three rows exist in the memory cell array block B, and if the defective cells for one row exist in the memory cell array block D, the configuration goes as follows. That is, the four fuses F51, F52, F53 and F55 are blown. As a result of these fuse blowings, the transfer gates G51A, G51B, G52A, G52B, G53A and G53B are switched ON, whereby the row spare cells SMC111, SMC211 and SMC311 are electrically connected to the bit line pair d1, d2 of the memory cell array block B. On the other hand, the transfer gates G55A, G55B are switched ON, whereby the row spare cells SMC411 are electrically connected to the bit line pair d1, d2 of the memory cell array block D.

In such a state, when the word line MWL of the defective memory cell in the memory cell array block B is selected, the corresponding row spare cell is selected by use of the program circuit P51, P52 or P53. In this case, this word line MWL of the defective cell can be made non-selected state, for example, by cutting fuses corresponding to this word line. Similarly, when the word line MWL of the defective cell in the memory cell array block D is selected, the word line MWL of the row spared cell SMC411 is selected by use of the program circuit P54. Thus, this chip is relieved.

There has been explained so far the case where the row spare cell group is shared. Given next is a case where the column spare cell group is shared. That is, as illustrated in FIG. 5, the column spare cell group cd is shared by the memory cell array blocks C and D. The bit line pair d1, d2 of the memory cell group of the memory cell array block C are connected to I/O lines 67 and 68 via column switch transistors C1 and C2, respectively. The column spare cell group cd has four columns of column spare cells SMC1(1, 1), . . . , SMC1(64, 1), SMC2(1, 2), . . . , SMC2(64, 2), SMC3(1, 3), . . . , SMC3(64, 3), SMC4(1, 4), . . . , SMC4(64, 4). The respective column spare cell SMC1(64, 1), SMC2 (64, 2), SMC3(64, 3), SMC4(64, 4) are connected to the I/O lines via the G61B, G62A, G62B, G63A, G63B, G64A, G64B. Circuits for applying control voltages to the gates of the transfer gates are respectively constructed of fuses F61, F62, F63, F64, F65, resistors R61, R62, R63, R64, R65 and inverters INV61, INV62, INV63, INV64, INV65. The column spare cells SMC1(64, 1), SMC2(64, 2), SMC3(64.3) and SMC4(64, 4) individually include column switch transistors C1, C2, . . . , C1, C2. Gates thereof are connected to program circuits P61, P62, P63 and P64. The program circuits P61–P64 are similarly constructed as that shown in FIGS. 7A and 7B. The relief of the chip by use of the above-described column spare cell group cd is similar to the case of the row spare cell group bd, and hence the explanation thereof will be omitted.

Furthermore, in order to obtain a second embodiment wherein the row and column spare cells are shared, involves a combination of sharing the above-mentioned row spare cell group and sharing the column spare cell group.

Figure 6:
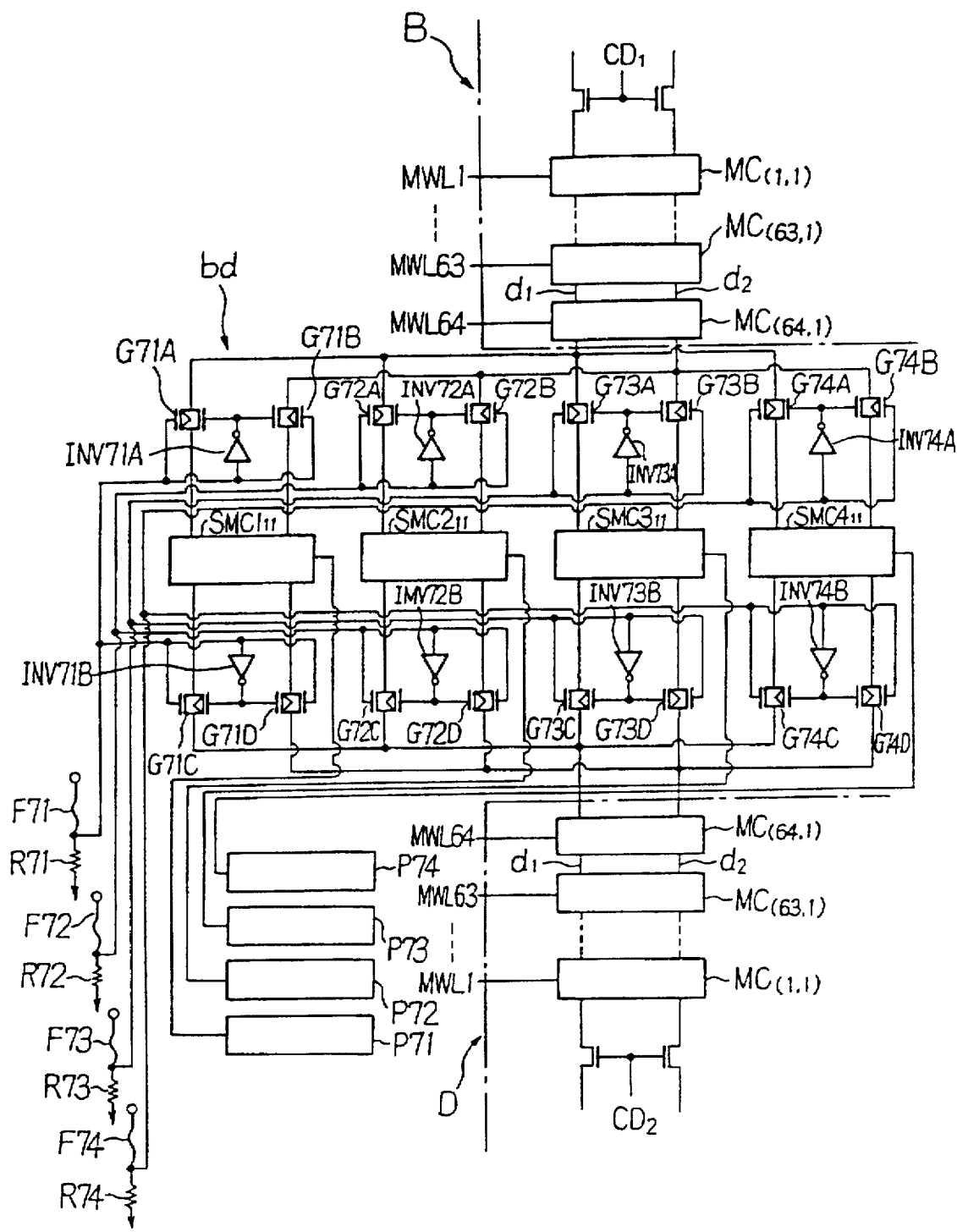
FIG. 6 is a diagram showing details of the principal portion of a modification of the first embodiment.

A modified embodiment of sharing the row space cell group may be obtained by connecting the row spare cells in parallel. As illustrated in FIG. 6, the respective row spare cells SMC111, SMC211, SMC311 and SMC411 are connected to the memory cell array blocks B and D through no intermediary of other spare cells. That is, one end of the row spare cell SMC111 is connected to the bit line pair d1, d2 of the memory cell array block B via the transfer gates G71A and G71B, while the other end thereof is connected to the memory cell array block D via the transfer gates G71C and G71D. Other spare cells SMC211, SMC311, SMC411 are similarly connected to the memory cell array block B via the transfer gates G72A and G72B, G73A and G73B, G74A and G74B, and also to the memory cell array block D via the transfer gates G72C and G72D, G73C and G73D, G74C and G74D, respectively.

Further, circuits for applying the control voltages to the gates of the transfer gates are respectively constructed of fuses F71, F72, F73 and F74, resistors R71, R72, R73 and R74, and inverters INV71A, 71B, 72A, 72B, 73A, 73B, 74A and 74B. Program circuits P71, P72, P73 and P74 are connected to the row spare cells SMC111, SMC211, SMC311 and SMC411.

The following is an explanation of how the spare cells are allocated. That is, the transfer gates G71A, G71B, G71C, G71D, . . . , G74A, G74B, G74C and G74D are switched ON/OFF depending on whether the fuse F71–F74 are blown or not, and the row spare cells SMC111, SMC211, SMC311 and SMC411 are electrically connected to the bit line pair d1, d2 of one of the memory cell array blocks B or D. Thus, the spare cells are allocated. Further, when the address of the defective cell is selected, the program circuits P71, P72, P73 and P74 select addresses of the corresponding spare cells SMC111, SMC211, SMC311, SMC411.

Further, in the above row/column spare cell groups also, the construction may be such that the column spare cell are connected in parallel. Moreover, it is possible to adopt a construction wherein those row/column spare cell groups are combined.

Note that the transfer gates G51A, G51B, . . . G55B, G61A, G61B, . . . G65B and G71A, G71B, . . . G74D, etc. can directly be constructed of the fuses, similarly to other embodiments. In this case, a fuse at a desired portion is blown off by electrification or irradiation of laser beams when it is necessary, whereby an open state can be obtained. When a material having a comparatively high resistance such as polysilicon is used as a material of the fuse, the resistance is applied directly to the data line, and there is a case of being delayed with time constants of the resistor and the capacitor. Then, if the fuse is composed by use of a low resistance element such as Al-Si, Al-Si-Cu or Cu, the above delay in terms of the time constant can be obviated.

In accordance with the embodiments of the present invention, one spare cell group is shared between the memory cell array blocks adjacent to each other, and the spare cells are allocated corresponding to the occurrence of the defective cell. Hence, the relieving rate can be enhanced without increasing the number of spare cells.

It is apparent that, in this invention, a wide range of different working modes can be formed based on the invention without deviating from the spirit and scope of the invention. This invention is not restricted by its specific working modes except being limited by the appended claims.

What is claimed is:

1. A semiconductor memory device comprising:

a memory cell array having a plurality of memory cell array blocks arranged in matrix form, each of said memory cell array blocks having a plurality of memory cells arranged in matrix form; and at least one spare cell group, the spare cell group being arranged between two of said memory cell array blocks that are adjacent to each other for replacing defective memory cells in said two adjacent memory cell array blocks, wherein said spare cell group includes a row spare cell group provided between said two adjacent memory cell array blocks, said row spare cell group having a plurality of spare cells arranged in one or more rows, said rows of spare cells in said row spare cell group are connected via switching means to both of said two adjacent memory cell array blocks so as to be shared by said two adjacent memory cell array blocks, and said switching means are controlled so that the rows of spare cells are divided between said two adjacent memory cell array blocks in accordance with the number of defective rows of memory cells in each of said two adjacent memory cell array blocks.

2. The semiconductor memory device according to claim 1, wherein the switching means cannot be used to connect the rows of spare cells in said row spare cell group to any of the memory cell array blocks other than said two adjacent memory cell array blocks.

3. The semiconductor memory device according to claim 1, wherein said switching means includes a transfer gate group, provided between each of the rows of spare cells in said row spare cell group, for dividing said rows of spare cells by being selectively mined off in accordance with the number of defective rows of memory cells in each of said two adjacent memory cell array blocks; and said semiconductor memory device further comprises a control circuit for controlling the turning off of a selected transfer gate group.

4. The semiconductor memory device according to claim 1, wherein said switching means includes first switching means and second switching means, said row spare cell group includes N rows (N>2) of spare cells and N−1 groups of first switching means, said N rows of spare cells and said N−1 groups of first switching means are alternately arranged, a first row of spare cells in said row spare cell group is connected to one of said two adjacent memory cell array blocks via one group of second switching means, and an N-th row of spare cells in said row spare cell group is connected to the other of said two adjacent memory cell array blocks via another group of second switching means.

5. The semiconductor memory device according to claim 4, further comprising a control circuit for turning on or off the groups of said first and second switching means in order to control the number of rows of spare cells that are connected to each of said two adjacent memory cell array blocks in accordance with the number of defective rows of memory cells in each of said two adjacent memory cell array blocks.

6. The semiconductor memory device according to claim 1, wherein said row spare cell group is connected in parallel to said two adjacent memory cell array blocks via itching means provided between said row spare cell group and each of said two adjacent memory cell array blocks.

7. The semiconductor memory device according to claim 6, further comprising a control circuit for mining on or off said itching means in order to control the number of rows of spare cells that are connected to each of said two adjacent memory cell array blocks in accordance with the number of defective rows of memory cells in each of said two adjacent memory cell array blocks.

8. The semiconductor memory device according to claim 1, further comprising a control circuit for providing a selection signal for selecting one of said rows of spare cells when one of said defective rows of memory cells is addressed.

9. The semiconductor memory device according to claim 4, wherein said first switching means and said second switching means are controlled by a control circuit that includes fuses made of low resistance elements.

10. The semiconductor memory device according to claim 6, wherein said switching means are controlled by a control circuit that includes fuses made of low resistance elements.

11. A semiconductor memory device comprising:

a memory cell array having a plurality of memory cell array blocks arranged in matrix form, the memory cell array blocks including a first, a second, and a third memory cell array block, each of said memory cell array blocks having a plurality of memory cells arranged in matrix form;

a row spare cell group provided between said first and second memory cell array blocks, which are adjacent to each other in a column direction, for replacing defective memory cells in said first and second memory cell array blocks, said row spare cell group having a plurality of spare cells arranged in one or more rows; and a column spare cell group provided between said first and third memory cell array blocks, which are adjacent to each other in a row direction, for replacing defective memory cells in said first and third memory cell array blocks, said column spare cell group having a plurality of spare cells arranged in one or more columns, wherein said rows of spare cells in said row spare cell group are connected via switching means to both said first and second memory cell array blocks so as to be shared by said first and second memory cell array blocks, and said switching means are controlled so that the rows of spare cells are divided between said first and second memory cell array blocks in accordance with the respective number of defective rows of memory cells in said first and second memory cell array blocks, and said columns of spare cells in said column spare cell group are connected via switching means to both said first and third memory cell array blocks so as to be shared by said first and third memory cell array blocks, and said switching means are controlled so that the columns of spare cells are divided between said first and third memory cell array blocks in accordance with the respective number of defective columns of memory cells in said first and third memory cell array blocks.

12. The semiconductor memory device according to claim 11,
  wherein the switching means cannot be used to connect the rows of spare cells in said row spare cell group to any of the memory cell array blocks other than said first and second memory cell array blocks, and
  the switching means cannot be used to connect the columns of spare cells in said column spare cell group to any of the memory cell array blocks other than said first and third memory cell array blocks.

13. The semiconductor memory device according to claim 12,
  wherein said switching means includes:
    a first transfer gate group, provided between each of the rows of spare cells in said row spare cell group, for dividing said rows of spare cells by being selectively turned off in accordance with the respective number of defective rows of memory cells in said first and second memory cell array blocks; and
    a second transfer gate group, provided between each of the columns of spare cells in said column spare cell group, for dividing said columns of spare cells by being selectively mined off in accordance with the respective number of defective columns of memory cells in said first and third memory cell array blocks, and
  said semiconductor memory device further comprises:
    a first control circuit for controlling the mining off of selected first transfer gate groups; and
    a second control circuit for controlling the turning off of selected second transfer gate groups.

14. The semiconductor memory device according to claim 11,
  wherein said switching means includes first switching means and second switching means,
  said row spare cell group includes N rows (N>2) of spare cells and N−1 groups of first switching means,
  said N rows of spare cells and said N−1 groups of first itching means are alternately arranged,
  at first row of spare cells in said row spare cell group is connected to said first memory cell array block via one group of second itching means, and
  an N−1 row of spare cells in said row spare cell group is connected to said second memory cell array block via another group of second switching means.

15. The semiconductor memory device according to claim 14, further comprising a control circuit for mining on or off the groups of said first and second switching means in order to control the number of rows of spare cells that are respectively connected to said first and second memory cell array blocks in accordance with the respective number of defective rows of memory cells in said first and second memory, cell array blocks.

16. The semiconductor memory device according to claim 11, wherein said row spare cell group is connected in parallel to said first and second memory cell array blocks via switching means provided between said row spare cell group and each of said first and second memory cell array blocks.

17. The semiconductor memory device according to claim 16, further comprising a control circuit for turning on or off said switching means in order to control the number of rows of spare cells that are respectively connected to said first and second memory cell array blocks in accordance with the respective number of defective rows of memory cells in said first and second memory cell array blocks.

18. The semiconductor memory device according to claim 11, further comprising a control circuit for providing a selection signal for selecting one of said rows of spare cells when one of said defective rows of memory cells is addressed.

19. The semiconductor memory device according to claim 14, wherein said first switching means and said second switching means are controlled by a control circuit that includes fuses made of low resistance elements.

20. The semiconductor memory device according to claim 16, wherein said switching means are controlled by a control circuit that includes fuses made of low resistance elements.

21. A semiconductor memory device comprising:
  a first memory cell array block having a plurality of memory cells arranged in matrix form, the first memory cell array block including memory cells connected to a first bit line pair;
  a second memory cell array block having a plurality of memory cells arranged in matrix form, the second memory cell array block including memory cells connected to a second bit line pair;
  a spare cell group arranged between the first and second memory cell array blocks for replacing defective memory cells in the first and second memory cell array blocks, the spare cell group including a plurality of spare cells coupled between the first bit line pair of the first memory cell array block and the second bit line pair of the second memory cell array block;
  a plurality of first transfer gate pairs, each first transfer gate pair being provided between two of the spare cells in the spare cell group; and
  a control circuit that controls the first transfer gate pairs so as to connect some of the spare cells to the first bit line pair of the first memory cell array block and others of the spare cells to the second bit line pair of the second memory cell array block, in accordance with the number of spare cells respectively required by the first and second memory cell array blocks.

22. The semiconductor memory device according to claim 21, further comprising:
  a second transfer gate pair provided between the spare cell group and the first bit line of the first memory cell array block; and
  a third transfer gate pair provided between the spare cell group and the second bit line of the second memory cell array block,
  wherein the control circuit also controls the second and third transfer gate pairs.

23. The semiconductor memory device according to claim 21, wherein the spare cells in the spare cell group cannot be connected to any of the other memory cell array blocks provided in the semiconductor memory device other than the first and second memory cell array blocks.

24. The semiconductor memory device according to claim 21,
  further comprising a selection circuit for providing a selection signal for selecting at least one of the spare cells in said spare cell group when a corresponding replaced memory cell in the first or second memory cell array block is addressed,
  wherein the selection circuit does not store information to indicate whether the spare cell is replacing a memory cell in the first memory cell array block or a memory cell in the second memory cell array block.

25. A semiconductor memory device comprising:
  a first memory cell array block having a plurality of memory cells arranged in matrix form, the first memory cell array block including memory cells connected to a first bit line pair;

a first column gate for selectively coupling the first bit line pair to a first data line pair, which corresponds to the first memory cell array block;

a second memory cell array block having a plurality of memory cells arranged in matrix form, the second memory cell array block including memory cells connected to a second bit line pair, which corresponds to the second memory cell array block;

a second column gate for selectively coupling the second bit line pair to a second data line pair;

a third data line pair that is coupled between the first and second data line pairs;

a spare cell group arranged between the first and second memory cell array blocks for replacing defective memory cells in the first and second memory cell array blocks, the spare cell group including a plurality of spare cells that are selectively coupled to the third data line pair via a plurality of third column gates;

a plurality of first transfer gate pairs, each first transfer gate pair being provided in the third data line pair between the coupling points of two spare cells in the spare cell group; and a control circuit that controls the first transfer gate pairs so as to couple some of the spare cells to the first data line pair and others of the spare cells to the second data line pair, in accordance with the number of spare cells respectively required by the first and second memory cell array blocks.

26. The semiconductor memory device according to claim 25, further comprising:

a second transfer gate pair provided between the first data line pair and the third data line pair; and a third transfer gate pair provided between the second data line pair and the third data line pair, wherein the control circuit also controls the second and third transfer gate pairs.

27. The semiconductor memory device according to claim 25, wherein the spare cells in the spare cell group cannot be coupled via the third data line pair to any of the other data line pairs, which correspond to other memory cell array blocks provided in the semiconductor memory device, other than the first and second data line pairs.

28. The semiconductor memory device according to claim 25, further comprising a selection circuit for providing a selection signal for selecting at least one of the third column gates in said spare cell group when a corresponding replaced memory cell in the first or second memory cell array block is addressed, wherein the selection circuit does not store information to indicate whether the spare cell is replacing a memory cell in the first memory cell array block or a memory cell in the second memory cell array block.

* * * * *